(12) United States Patent
Pio et al.

(10) Patent No.: US 6,462,400 B1
(45) Date of Patent: Oct. 8, 2002

(54) CHIP OUTLINE BAND (COB) STRUCTURE FOR INTEGRATED CIRCUITS

(75) Inventors: Federico Pio, Brugherio; Paola Zuliani, Milan; Lorenzo Fratin, Buccinasco, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/483,656

(22) Filed: Jan. 14, 2000

(30) Foreign Application Priority Data

Jan. 15, 1999 (EP) .............................................. 99830007

(51) Int. Cl.[7] ........................................... H01L 23/544
(52) U.S. Cl. ...................... 257/620; 257/618; 257/619
(58) Field of Search ................................. 257/368, 452, 257/618, 620, 619, 913, 490, 494, 495, 104, 106, 603, 605; 438/113, 458, 462

(56) References Cited

U.S. PATENT DOCUMENTS

| 4,265,685 A | 5/1981 | Seki ............................ 148/174 |
| 5,306,945 A | 4/1994 | Drummond .................. 257/620 |
| 5,559,362 A | * 9/1996 | Narita .......................... 257/620 |
| 5,814,887 A | * 9/1998 | Tani ............................. 257/751 |
| 5,969,408 A | * 10/1999 | Perelli ......................... 257/620 |

FOREIGN PATENT DOCUMENTS

JP    63-128733 A   *  6/1988

OTHER PUBLICATIONS

European Search Report from European Patent Application No. 99830007.3, filed Jan. 15, 1999.

\* cited by examiner

*Primary Examiner*—Steven Loke
*Assistant Examiner*—Donghee Kang
(74) *Attorney, Agent, or Firm*—Wolf, Greenfield & Sacks, P.C.; James H. Morris

(57) ABSTRACT

Chip Outline Band (COB) structure for an integrated circuit integrated in a semiconductor chip having a semiconductor substrate of a first conductivity type and biased at a common reference potential of the integrated circuit, the COB structure comprising a substantially annular region formed in the substrate along a periphery thereof, and at least one annular conductor region superimposed on and contacting the substantially annular region, wherein the substantially annular region is electrically connected at the common reference potential.

22 Claims, 5 Drawing Sheets

CHIP OUTLINE BAND (COB) STRUCTURE FOR INTEGRATED CIRCUITS

BACKGROUND OF THE INVENTION

1. Field of the Invention

The present invention relates to the field of integrated circuits. More specifically, the invention concerns a Chip Outline Band (COB) structure for integrated circuits, particularly for integrated circuits subject to electromagnetic fields.

2. Discussion of the Related Art

Every integrated circuit device is provided with a perimeter edge structure suitable to prevent external agents, such as humidity and contaminants, from deteriorating the mechanical and/or electrical properties of the device, both during the manufacturing and in operation.

To this end, during the integrated circuit manufacturing, a so-called Chip Outline Band (COB) is formed along the external perimeter of the integrated circuit. The COB acts as a barrier against the leakage of humidity and/or contaminants not only during the integrated circuit manufacturing, but also after the operation of scribing or separation of the plurality of chips integrated in a same semiconductor wafer.

The COB is essentially a passive element that allows achievement of the desired effect of acting as a barrier against leaking of humidity and/or contaminants, and relaxing the mechanical stress at the edge of the integrated circuit. This effect is achieved thanks to the physical-topological structure of the COB. The presence of PN junctions further allows exploitation of the built-in potential of the PN junctions to create an electric field which acts against the diffusion of contaminant ions (e.g., sodium).

FIG. 1 shows in cross-section a conventional COB structure. At the periphery of a semiconductor substrate 1 of a chip, for example of the P type, where a field oxide region 2 terminates, an N type region 3 is formed. Region 3 forms substantially a ring running along the periphery of the chip. Region 3 is contacted by a first metal ring 4, formed from a first metal layer, separated from the field oxide 2 by a dielectric layer 5. Region 3 is also contacted by a second metal ring 6, formed from a second metal layer, which over the field oxide 2 is separated from the first metal layer by an intermetal dielectric 7. The whole chip is covered by a passivation layer 8.

Several alternative embodiments for the COB structure shown in FIG. 1 can be conceived, depending, for example, on the number of different metal layers and, more generally, depending on the specific manufacturing process.

For example, as shown in FIG. 2, a further N+ ring 9, internal with respect to region 3, can be provided, the N+ ring 9 being contacted by a respective metal ring 10 formed from the first metal layer.

The COB forms a sort of external frame of the integrated circuit chip. In this way, the COB protects the whole perimeter of the chip.

FIG. 3 is an electrical diagram of the COB. The COB itself is depicted as a ring, coupled through a reverse diode D1 to the common ground GND of the integrated circuit, that is the substrate 1. As shown, the COB is a structure substantially isolated from the remaining electronic circuit integrated in the chip, in that the COB is not connected to any active element of the integrated circuit. The isolation of the COB is guaranteed by the presence of diode D1 (the PN junction diode formed by the N region 3 and the P substrate 1).

There are an increasing number of applications wherein the integrated circuits operate immersed in not negligible electromagnetic fields. An example is given by contactless "Smart Cards". Contactless Smart Cards work by taking the electric power supply from the surrounding electromagnetic field. The electromagnetic field is typically in the radio frequency range. The Smart Card is coupled to the electromagnetic field by means of a coil, conventionally external to the integrated circuit embedded in the card; however the coil could as well be integrated in the integrated circuit. The sinusoidal signal induced by the electromagnetic field in the coil is then rectified and used as a power supply. The exchange of information between the integrated circuit and the outside takes place through a coil, possibly by superimposing the information signal on a carrier wave.

In these devices, or more generally in devices which have to work immersed in an electromagnetic field, the COB can act as a disturbance element, since the COB's structure is essentially that of a coil, so the COB couples to the electromagnetic field. An induced sinusoidal signal can thus develop in the COB. The induced sinusoidal signal can forward bias the PN junction associated with the COB, so that carriers can be injected into the substrate. The disturbance depends on the frequency of the signal, and on the power of the electromagnetic radiation, as well as on the size of the integrated circuit chip, and on the particular COB structure. The disturbance can also vary with the baud rate of the contactless interface.

Thus, even if the provision of a COB is necessary in an integrated circuit chip, it can interfere with the correct operation of the integrated circuit.

In view of the state of the art described, it is an object of the present invention to provide a COB structure for an integrated circuit that is not affected by the aforementioned problems.

SUMMARY OF THE INVENTION

According to the present invention, this and other objects are achieved by a COB structure for an integrated circuit integrated in a semiconductor chip having a semiconductor substrate of a first conductivity type and biased at a common reference potential of the integrated circuit, the COB structure comprising a substantially annular region of a second conductivity type formed in the substrate along a periphery thereof, and at least one annular conductor region superimposed on and contacting the substantially annular region, wherein said substantially annular regions are electrically connected at said common reference potential.

BRIEF DESCRIPTION OF THE DRAWINGS

The features and advantages of the present invention will be made apparent by the following detailed description of some particular embodiments thereof, illustrated by way of non-limiting examples only in the annexed drawings, wherein.

DETAILED DESCRIPTION

Figure 3:
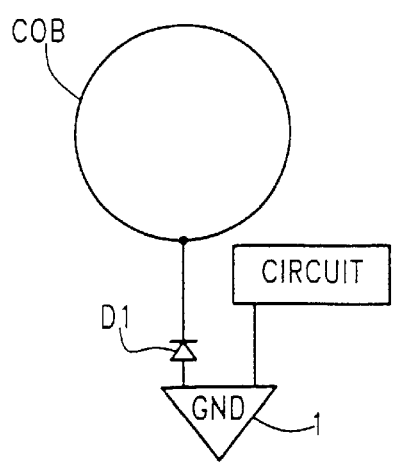
FIG. 3 is a schematic electrical diagram of the conventional COB structures of FIGS. 1 and 2.
Figure 4:
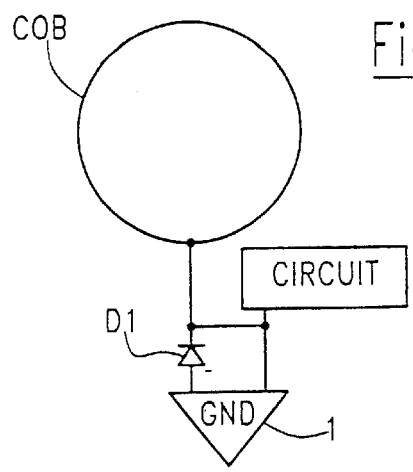
FIG. 4 is a schematic electrical diagram of a COB structure according to a first embodiment of the present invention.
Figure 5:
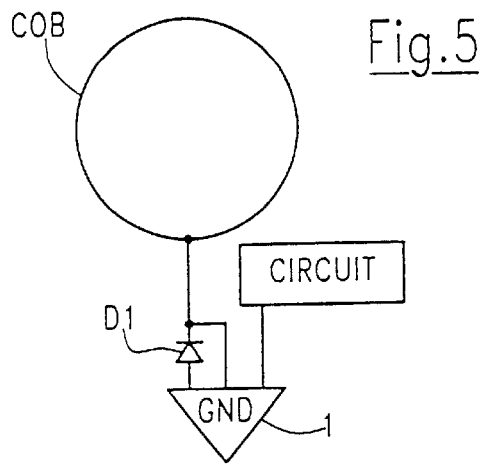
FIG. 5 is a schematic electrical diagram of a COB structure according to a second embodiment of the present invention.

Referring to FIG. 4, a schematic electrical diagram of a COB structure according to a first embodiment of the present invention is shown. As visible, differently from the conventional structure of FIG. 3, the COB according to the present invention is not merely coupled to the common ground GND of the integrated circuit via a back-connected diode D1; the COB structure of the invention is in fact electrically connected to the common ground GND of the integrated circuit. The second embodiment, schematically shown in FIG. 5, similarly provides for an electrical connection of the COB to the common ground of the integrated circuit, but such a connection is realized by means of a direct contact of the COB to the substrate.

Thanks to this COB structure, even in presence of electromagnetic fields, it will not be possible for the PN junction associated with the COB structure to be forward biased. Further, since in a contactless device there is not provided an external reference voltage, the common ground GND is a virtual ground, and all the internal voltages of the integrated circuit will track the variations of the virtual ground.

Figure 1:
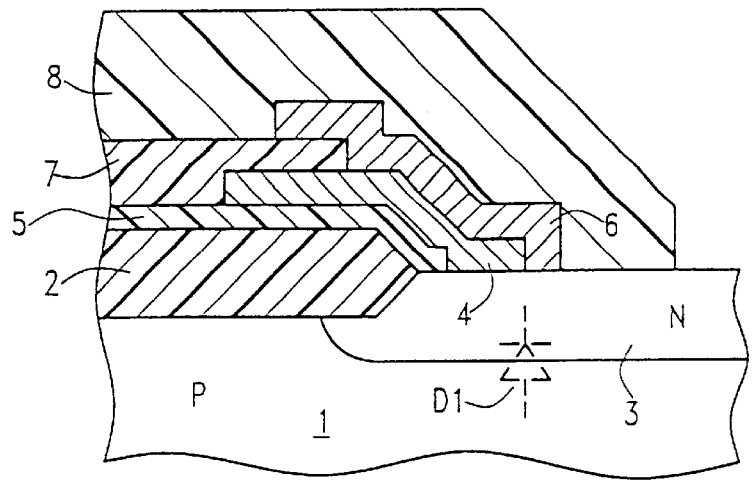
FIG. 1 is a cross-sectional view of a conventional COB structure.
Figure 2:
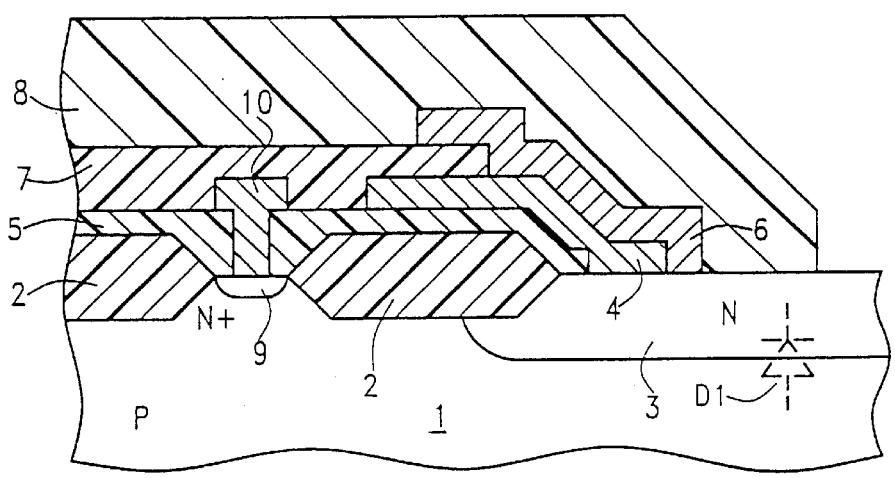
FIG. 2 is a cross-sectional view of another conventional COB structure.
Figure 6:
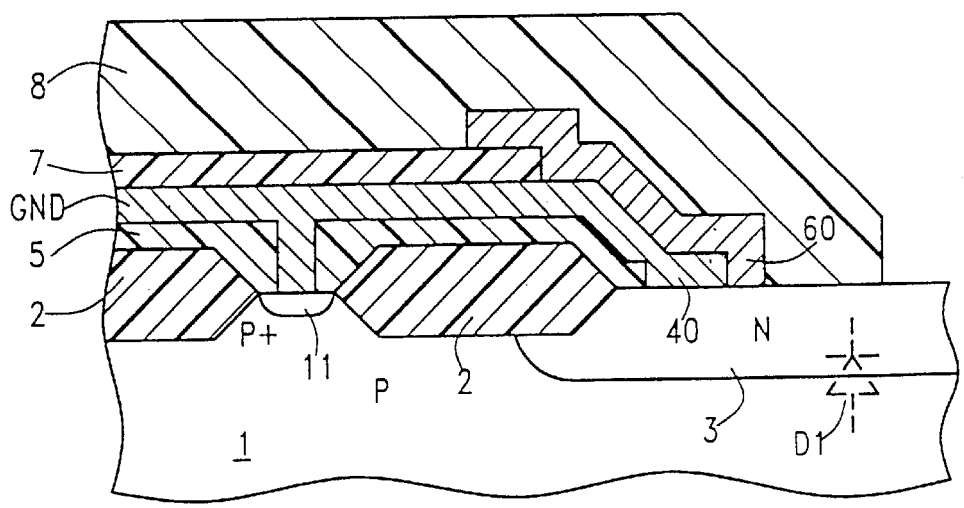
FIG. 6 is a cross-sectional view of a COB structure according to the first embodiment of the invention.

FIG. 6 shows in cross-section a COB structure according to the first embodiment of the invention. An internal ground ring GND, for example formed from the first metal layer, contacts the P substrate 1 through a P+ annular region or ring 11. The ground ring GND formed from the first metal layer extends toward the periphery of the integrated circuit to form a ring 40 of the COB structure, running along the perimeter of the integrated circuit chip. The ring 40 contacts the N type annular or ring region 3, running along the periphery of the chip, which is thus connected to the integrated circuit ground. A ring 60 formed from the second metal layer similar to the ring 6 in FIG. 1 is also provided, ring 60 contacting the N type region 3. The short-circuit between the internal ground ring GND and the N type region 3 is not necessarily formed by means of the same first metal layer forming the internal ground ring: the short-circuit could as well be provided in any other suitable way.

Figure 7:
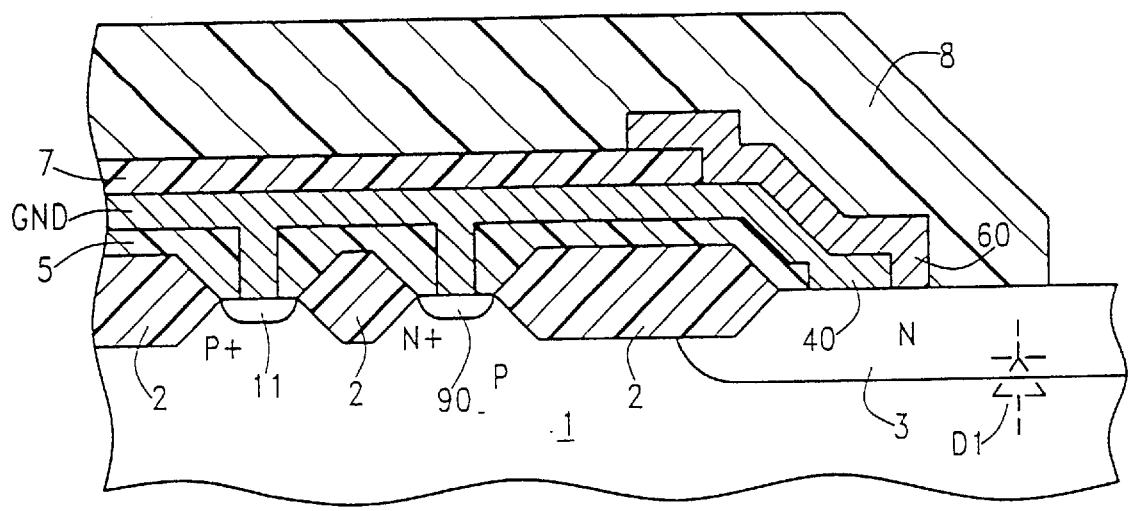
FIG. 7 is a cross-sectional view of another COB structure according to the first embodiment of the invention.

In FIG. 7 a cross-sectional view of another COB structure according to the first embodiment of the invention is shown. In this case, between the P+ ring 11 and the N type region 3 an N+ ring 90 is provided, and the internal ground ring GND contacting the P+ region 11 extends toward the periphery of the chip to contact both the N+ region 90 and the N type region 3. Thus, the N+ region 90 and the N type region 3 are short-circuited to the integrated circuit ground.

Figure 8:
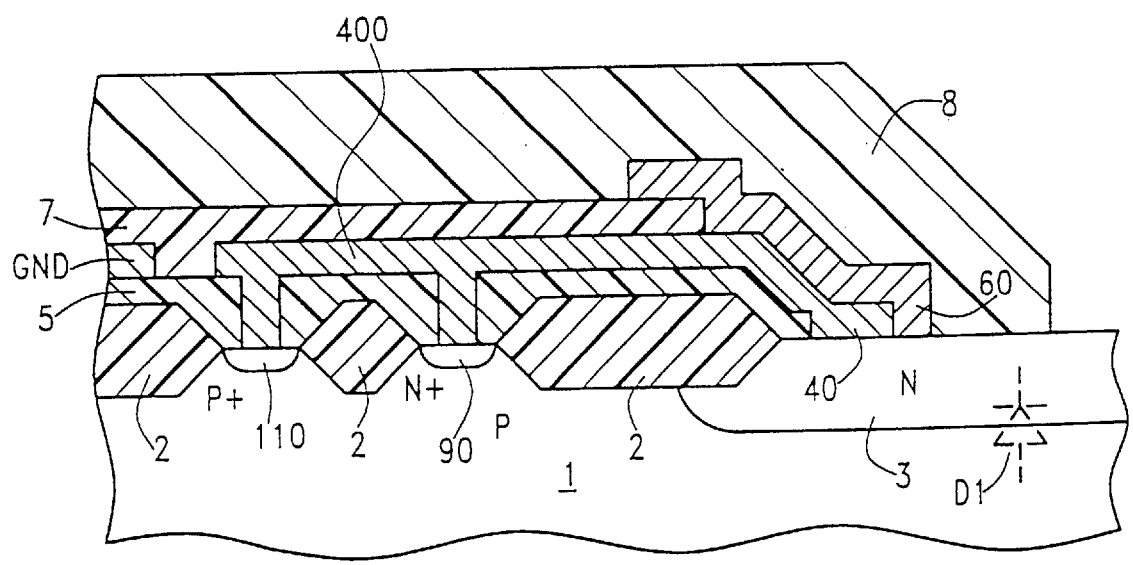
FIG. 8 is a cross-sectional view of a COB structure according to the second embodiment of the invention.

FIG. 8 shows a cross-section of a COB structure according to the second embodiment of the invention. In this case the N+ region 90 and the N type region 3 of the COB are not directly short-circuited to the internal ground ring GND formed from the first metal layer. The contact to the integrated circuit ground is instead provided through the substrate 1, by means of a ring 400 formed from the first metal layer and electrically connected to ring 40, and a P+ region 110 formed in the substrate. The metal ring 400 contacts the substrate 1 through the P+ region 110, and then contacts the N+ region 90 and the N type region 3.

Figure 9:
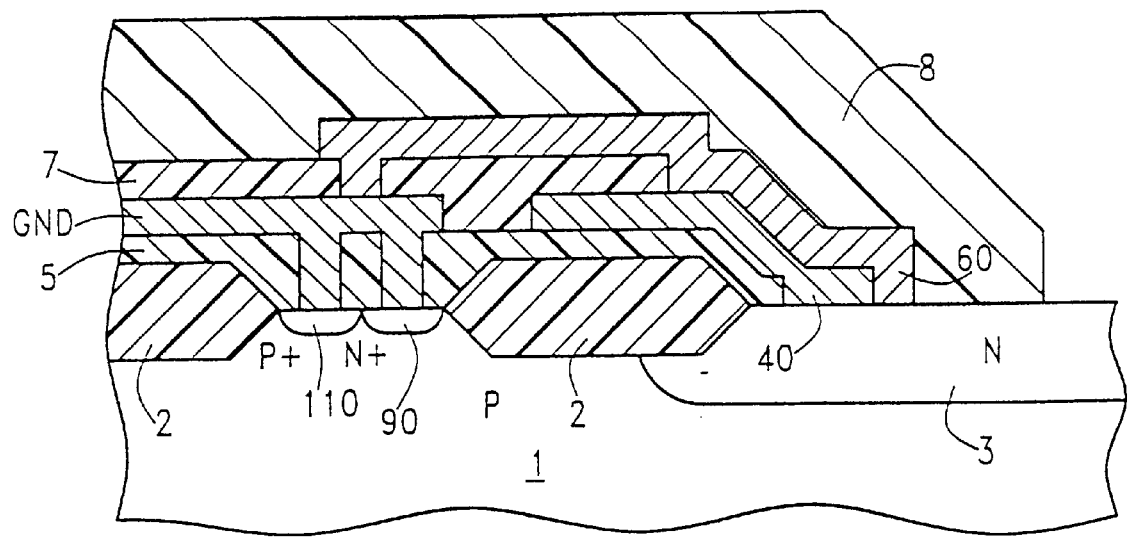
FIGS. 9 and 10 are cross-sectional views of two further COB structures according to the first embodiment of the invention.

FIG. 9 shows in cross-section a further COB structure according to the first embodiment of the invention. In this structure an "abutting contact" is provided, that is a common contact to both the P+ (region 110) and N+ (region 90) active areas. The contact region of the internal ground ring GND to the P+ and N+ regions 110, 90 is partially superimposed over the P+ region, and partially over the N+ region. The P+ and N+ regions are adjacent to each other. The internal ground ring GND, formed from the first metal layer, is then connected to the metal ring 40 of the COB through a ring 60 formed from the second metal layer.

Figure 10:
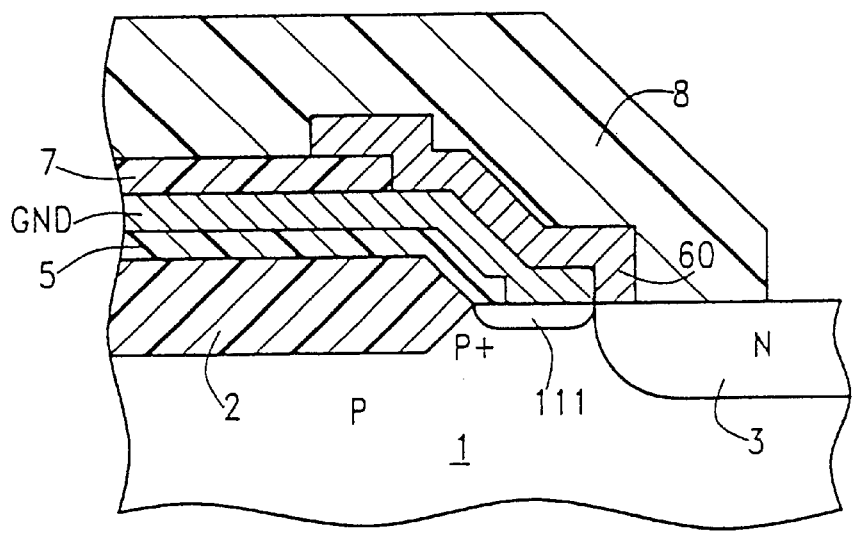

In FIG. 10 a still further COB structure according to the first embodiment of the invention is shown. Also the COB structure of FIG. 10 provides for abutting contacts. A P+ region 111 adjacent to the N type region 3 is provided. The internal ground ring GND contacts the P+ region 111. The second metal layer COB ring 60 is superimposed over the internal ground ring GND, and contacts the N type region 3.

In all the shown embodiments, the COB is electrically connected, by means of one of the metal layers of the integrated circuit, to the GND lines of the integrated circuit. So, the COB is not a passive element electrically isolated from the integrated circuit. In any case, the same result is achieved even if the COB is not connected to the GND lines by means of metal layers: the substrate could perform the same function, even if with a higher resistivity.

If the integrated circuit does not have a contactless interface, i.e. a ground pad is provided to be biased from the outside, it is preferable that the COB is connected to such a node.

Figure 11:
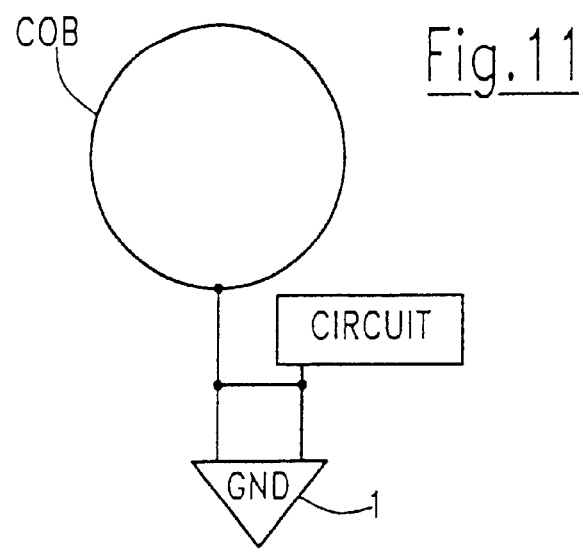
FIG. 11 is a schematic electrical diagram of a COB structure according to a third embodiment of the invention.
Figure 12:
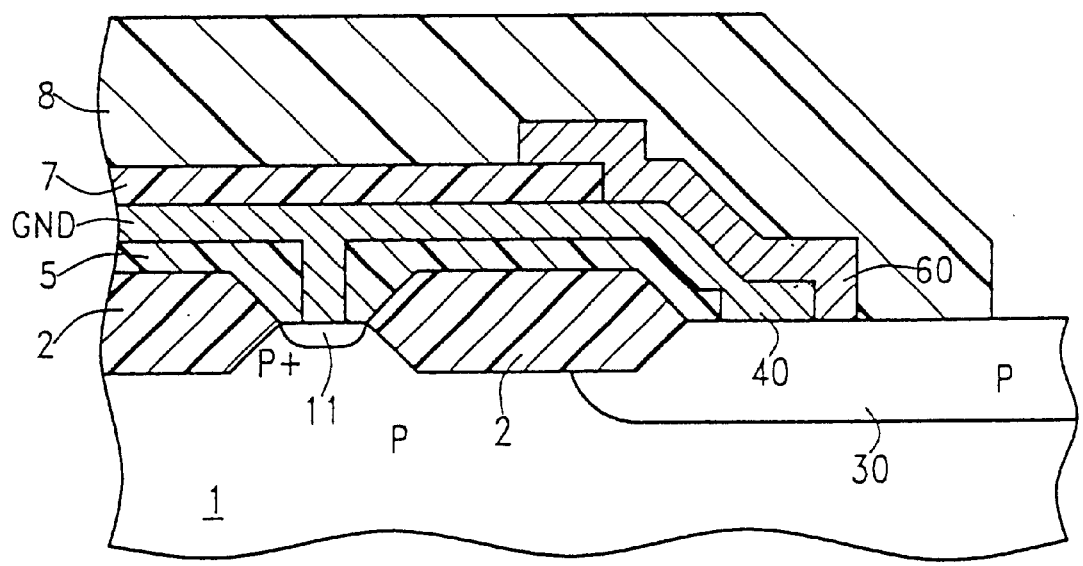
FIG. 12 is a cross-sectional view of a COB structure according to the third embodiment of the invention.

FIG. 11 shows an electrical diagram of a COB structure according to a third embodiment of the present invention. In this embodiment, differently from those schematically depicted in FIGS. 4 and 5, no diode D1 is present, and the COB is electrically connected to the substrate 1 of the integrated circuit. Additionally, according to the invention, the COB is also electrically connected to the ground rail of the circuit. The physical structure of the COB according to this third embodiment is shown in FIG. 12, which is similar to FIG. 6 and all identical elements are denoted by the same reference numerals. Instead of having an N type region 3 running along the periphery of the chip, a P type region 30 is provided. The metal ring 40 contacts the P type region 30. Region 30 has a doping level suitable for making the contact to the metal ring 40 a good ohmic contact. The provision of the direct electrical contact between the metal ring 40 and the ground rail GND of the circuit guarantees that the COB is always at the ground potential, while if no direct contact to the ground rail GND of the circuit were provided, and only the electrical connection to the substrate 1 were exploited, there could be voltage drops due to the not negligible resistivity of the substrate.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Chip Outline Band (COB) structure for an integrated circuit integrated in a semiconductor chip having a semiconductor substrate of a first conductivity type and biased at a common reference potential of the integrated circuit, the COB structure comprising a substantially annular region formed in the substrate along a periphery thereof, a conductance path from the annular region to said common reference potential, and at least one annular conductor region superimposed on and contacting the substantially annular region and forming at least part of the conductance path, wherein said substantially annular region is electrically connected to said common reference potential.

2. COB structure according to claim 1, wherein the substantially annular region is of the first conductivity type.

3. COB structure according to claim 2, wherein the at least one annular conductor region of the COB structure is electrically connected to a reference potential conductor rail providing the reference potential to the integrated circuit.

4. COB structure according to claim 1, wherein the substantially annular region is of a second conductivity type.

5. COB structure according to claim 4, wherein the substantially annular region is electrically connected to said substrate.

6. COB structure according to claim 5, wherein the at least one annular conductor region of the COB structure is electrically connected to a reference potential conductance path providing the reference potential to the integrated circuit.

7. COB structure according to claim 6, wherein the reference potential conductance path is an annular conductor internal to the annular conductor region of the COB.

8. COB structure according to claim 7, wherein the reference potential conductance path also contacts the substrate.

9. COB structure according to claim 8, wherein the reference potential conductance path extends toward the periphery of the chip to merge with said at least one annular conductor region.

10. COB structure according to claim 9, wherein the reference potential conductance path and said annular conductor region are formed from a same metal layer.

11. COB structure according to claim 6, wherein the at least one annular conductor region comprises a first annular conductor region formed from a same first metal layer as said reference potential conductance path, and a second annular conductor region formed from a second metal layer is provided which runs along the periphery of the chip to contact the first annular conductor region, the second annular conductor region also contacting the reference potential conductance path to bias the substantially annular region at said reference potential.

12. COB structure according to claim 5, wherein the at least one annular conductor region contacts the substrate to bias the substantially annular region at said reference potential.

13. COB structure according to claim 4, further by comprising an additional substantially annular region of the second conductivity type, internal to and more heavily doped than said substantially annular region, the additional substantially annular region also electrically connected to said reference potential.

14. A structure for protecting an integrated circuit formed in a semiconductor substrate, the structure comprising:

a first region formed in the semiconductor substrate and forming an annulus around the integrated circuit; and at least one conductor region formed over and in contact with the first region; and a conductance path from the first region to a common reference potential of the integrated circuit, wherein the at least one conductor region forms at least part of the conductance path.

15. The protection structure according to claim 14, wherein the conductance path includes a reference potential layer of the integrated circuit.

16. The protection structure according to claim 15, wherein the at least one conductor region has a first portion forming an annulus around the integrated circuit.

17. The protection structure according to claim 16, wherein the reference potential layer forms a common virtual ground ring of the integrated circuit internal to the annular first portion of the at least one conductor region.

18. The protection structure according to claim 14, wherein the conductance path includes the semiconductor substrate.

19. The protection structure according to claim 18, wherein the conductance path includes a reference potential layer of the integrated circuit.

20. The protection structure according to claim 17, wherein the first portion and the ground ring are formed from a same metal layer.

21. A structure for protecting an integrating circuit formed in a semiconductor substrate, the structure comprising:

a first annular region formed in the semiconductor substrate; and a first annular conductor region formed over and in contact with the first region; and a second annular conductor region contacting the first annular conductor region; and a reference potential layer of the integrated circuit; and a conductance path from the first annular region to a common reference potential of the integrated circuit, wherein the first annular region and the reference potential layer are formed in a same first metal layer and the second annular region is formed in a second metal layer, and the conductance path includes the first annular conductor region, the second annular conductor region, and the reference potential layer.

22. The protection structure according to claim 21, wherein the reference potential layer forms a common virtual ground ring of the integrated circuit internal to the first annular conductor region.

* * * * *